United States Patent [19]

Smith et al.

[11] 4,383,165

[45] May 10, 1983

[54] METHOD FOR ALIGNING LASER BEAM WITH FUSES IN INTEGRATED CIRCUIT

[75] Inventors: Ronald J. Smith; John P. Dishaw, both of San Jose, Calif.

[73] Assignee: Intel Corporation, Santa Clara, Calif.

[21] Appl. No.: 257,505

[22] Filed: Apr. 21, 1981

[51] Int. Cl.³ .................. B23K 26/00; B23K 26/02; B23K 26/04

[52] U.S. Cl. .................. 219/121 LN; 219/121 LX; 219/121 LZ

[58] Field of Search .................. 29/610 R, 620; 219/121 LY, 121 LZ, 121 LM, 121 LH, 121 LJ, 121 LU, 121 LN; 338/195

[56] References Cited

U.S. PATENT DOCUMENTS 3,758,745  9/1973  Wilker et al. ............... 219/121 LM
4,228,528 10/1980  Cenker et al. ............... 365/200

Primary Examiner—B. A. Reynolds
Assistant Examiner—M. M. Lateef
Attorney, Agent, or Firm—Blakely, Sokoloff, Taylor and Zafman

[57] ABSTRACT

A method is disclosed for aligning a laser beam to an integrated circuit. A pair of generally parallel spaced-apart fusible links are formed on the circuit. The laser beam is positioned to a site known to be to one side of one link. Then the beam is stepped towards the links until the link is blown. The beam is then moved a predetermined distance so that it is positioned to one side of the other link. This beam is then stepped toward this link in the opposite direction until it is blown. The midpoint between the links can then be readily computed.

13 Claims, 10 Drawing Figures

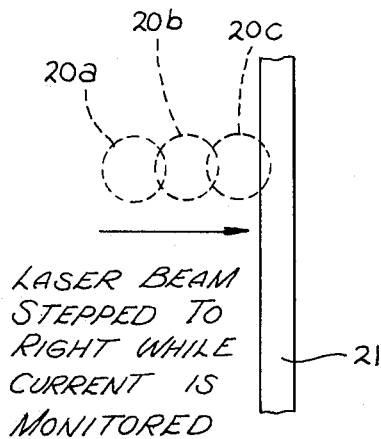
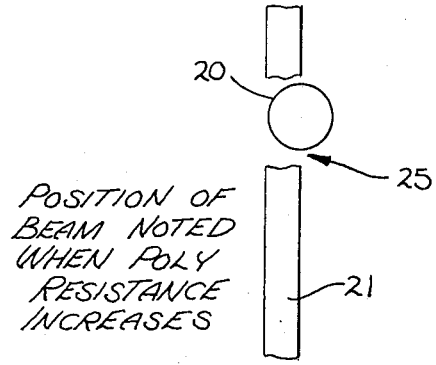
*Fig. 3*   *Fig. 4*
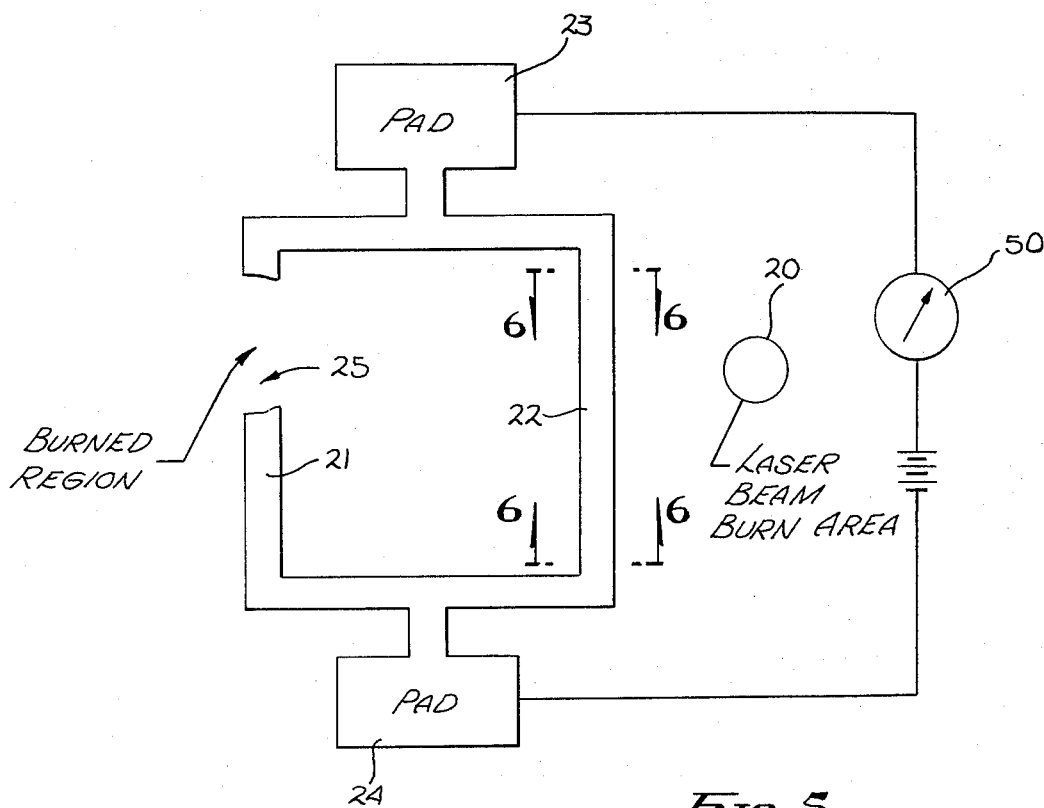
*Fig. 5*

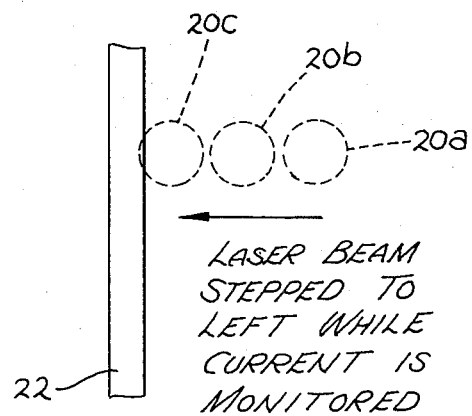
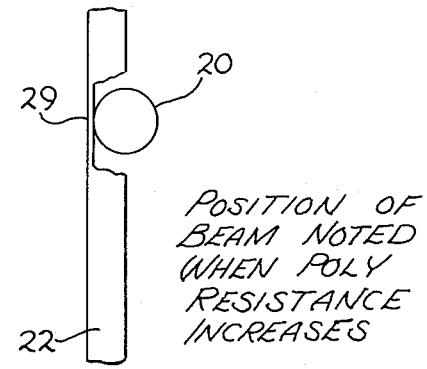
Fig. 6
Fig. 7
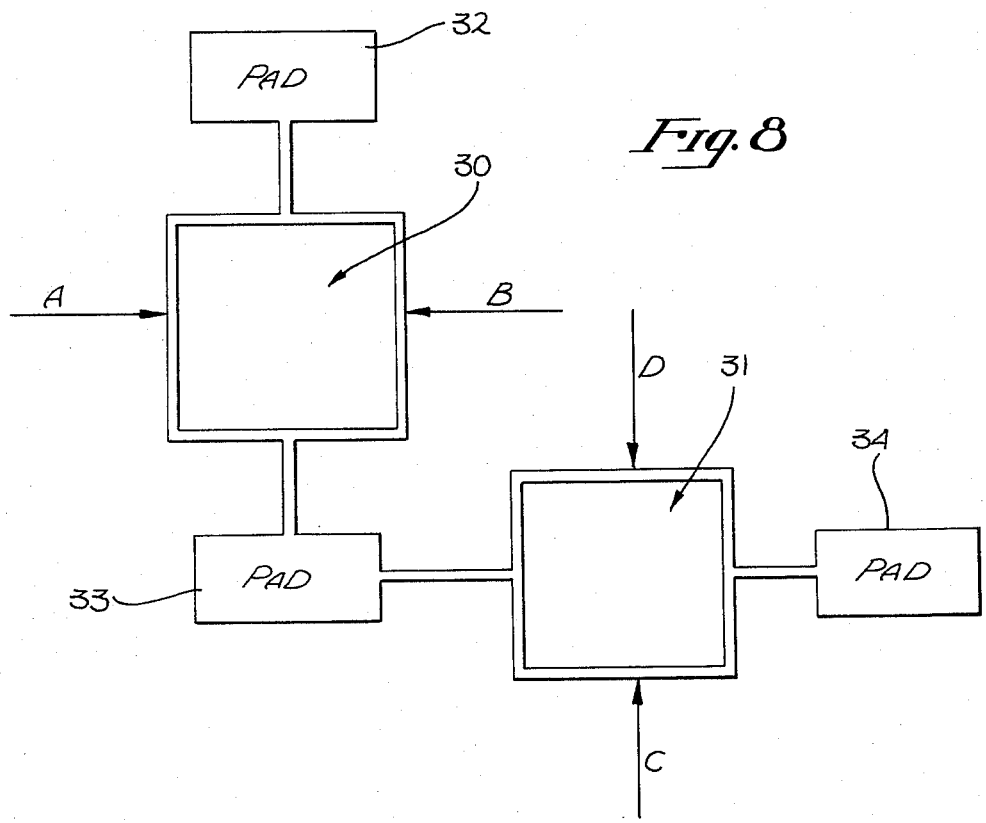
Fig. 8

R1 << R2

METHOD FOR ALIGNING LASER BEAM WITH FUSES IN INTEGRATED CIRCUIT

BACKGROUND OF THE INVENTION

1. Field of the Invention

The invention relates to the field of aligning a laser beam with circuit elements in an integrated circuit.

2. Prior Art

In the fabrication of integrated circuits, particularly metal-oxide-semiconductor (MOS) memories, redundant elements such as redundant rows and columns are sometimes fabricated on each circuit or die. If it is determined that the memory has a faulty element, a discretionary connection (or disconnection) is made to effectively decouple the faulty element from the memory and couple the redundant element into the memory.

Most often, these redundant elements are selected by electrically blowing fuses such as polysilicon fuses, or aluminum fuses. (Such fuses are also used to program read-only memories.) See U.S. Pat. No. 3,792,319 for a description of a polysilicon fusible link.

An alternate method discussed in the prior art is blowing these fusible links by laser irradiation. (See U.S. Pat. No. 4,228,528). To blow these links with a laser beam, it is necessary to precisely align the laser beam to the fusible link. While this may be done manually, an automated system of alignment is necessary for high volume production.

A prior art method for aligning a laser beam to elements in an integrated circuit is described in conjunction with FIG. 1.

SUMMARY OF THE INVENTION

A method for determining the position of a laser beam on an integrated circuit is described. A link of material which is susceptible to alteration by a laser beam is formed within the circuit. The electrical characteristics of this link are monitored, for example, its resistance is monitored. The laser beam is positioned on the circuit at a site known to be spaced-apart from the link. The distance between the link and beam is decreased until the beam contacts the link. This contact is determined by noting a change in the electrical characteristics of the link. Since the location of the link within the circuit is known, the location of the beam relative to other circuit elements such as fuses is then determinable.

In the presently embodiment, as will be described, the links are formed in pairs, and each pair of links is blown by moving toward the beam from opposite directions. This compensates for the error caused by the fact that the beam burn area and link width are finite.

BRIEF DESCRIPTION OF THE DRAWINGS

FIG. 3 is a partial view of one of the links of FIG. 2, generally taken through section line 3—3 of FIG. 2. This view shows the beam being stepped toward the link.

FIG. 4 illustrates the link of FIG. 3 after the link has been blown by the laser beam.

FIG. 5 illustrates the links of FIG. 2 with one link blown and also illustrates the position of the laser beam after the first link has been blown.

FIG. 6 is a partial view of the second link; this view is generally taken through section line 6—6 of FIG. 5. This view also illustrates the stepping of the beam toward the link.

FIG. 7 illustrates the link of FIG. 6 after the link has been blown by the laser beam.

FIG. 8 is a plan view showing the placement of two sets of links in an integrated circuit as done in the presently preferred embodiment.

FIG. 9b is the equivalent circuit for the links of FIG. 9a.

DETAILED DESCRIPTION OF THE INVENTION

A method is described for determining the position of a laser beam on an integrated circuit. The method is particularly designed for the blowing of fuses or links in a semiconductor memory to couple redundant elements into the memory. However, the described process can be used to align the laser beam in the integrated circuit for other purposes such as for the blowing of fuses to program a read-only memory or discretionary wiring of any type.

Figure 1:
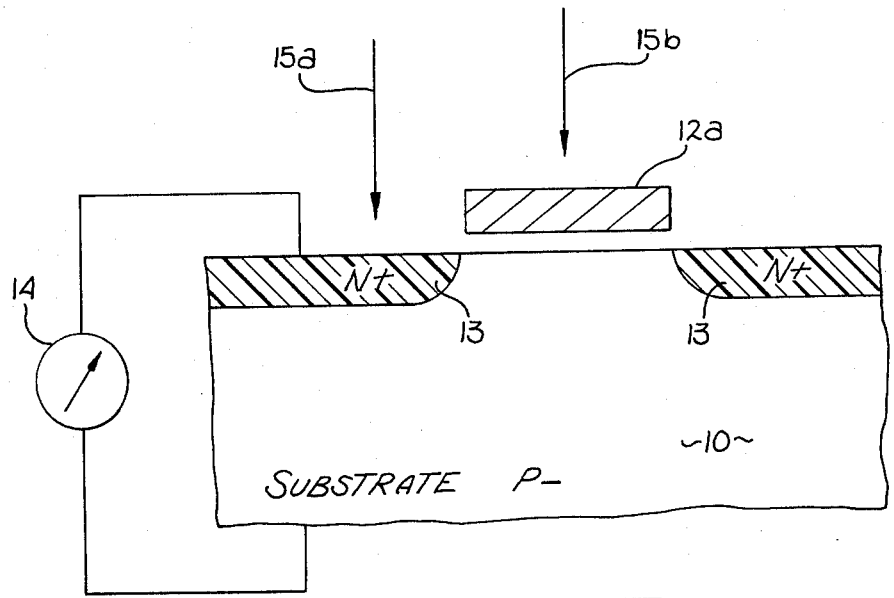
FIG. 1 is a cross-sectional elevation view of a substrate, used to describe a prior art method of aligning a laser beam with circuit members formed in an integrated circuit.

First referring to FIG. 1, a prior art method of determining the location of a laser beam on a circuit is illustrated. This prior art alignment technique determines the location of the pad 12 as will be described. Once the location of the pad 12 is known, the location of other elements in the circuit, such as fuses can be determined since their location relative to the pad 12 is known.

During the fabrication of an integrated circuit on the substrate 10, the pad 12 is formed. The pad 12 is surrounded by a doped region such as the heavily doped n-type region 13 illustrated in FIG. 1.

To locate the pad 12 the current between the doped region 13 and the substrate is monitored as illustrated by the meter 14. The substrate 10 is roughly aligned beneath the laser beam. Generally, the approximate location of the pad 12 is known and using this information, the laser beam can be directed at least onto the doped region 13. As illustrated by the beam 15a, assume that the beam is incident on the doped region 13; this causes a current to flow which is monitored by the meter 14. The laser beam 15a is then moved until the beam (shown as beam 15b) strikes the pad 12. When this occurs, the current drops and thus, it is known that the beam is at the pad 12. In some prior art processes, the pad 12 and the fuses used in the circuit are fabricated from aluminum. When the laser beam strikes the pad 12 it is reflected, and thus fairly precise registry can be achieved between the beam and the pad 12. Unfortunately, the reflective quality of the aluminum which allows this precise alignment, also makes it more difficult to blow the aluminum fuses.

In other cases, polysilicon pads and fuses are used. The polysilicon does not substantially absorb the radiation at the wavelengths used and thus it is difficult to provide precise alignment between the beam and the pad 12. On the other hand, the polysilicon links are easier to blow than are the aluminum links. (Another problem with locating a polysilicon pad is that the absorption characteristics are also dependent on the doping level and thus vary from process to process and even from wafer to wafer.)

Using an aluminum alignment pad with polysilicon fuses does not yield adequate alignment due to the inherent misregistration between the aluminum layer and the polysilicon layer.

In another prior art technique the laser beam is reflected from a circuit pad and sensed by a diode which is mounted external to the circuit. This technique has some of the same problems discussed above. Additionally, the glass layer above the pad causes beam distortion.

As will be seen in the following description, the present invention provides a method for determining the location of a laser beam on an integrated circuit without relying upon the alignment of a laser beam to a pad such as the pad 12 of FIG. 1.

In the following description, numerous specific details are set forth such as specific dimensions, materials, etc., in order to provide a thorough understanding of the present invention. It will, however, be obvious to one skilled in the art that the present invention may be practiced without these specific details. In other instances, well-known processing steps and methods have not been described in detail in order not to obscure the present invention in unnecessary detail.

Before describing the present invention in detail, it will be useful to have a general understanding of the production environment in which the invented method is used. Typically, hundreds of integrated circuits are fabricated simultaneously on a single wafer. Before the wafer is sliced into the individual circuits (dice) each of the circuits on the wafer are tested to identify the functioning circuits. A probe tester moves from circuit to circuit and automatically tests each of the circuits. This tester generally includes a plurality of probes which contact the pads of each circuit. (The pads are relatively large and thus aligning the probes with the pads of each circuit does not present a major problem.)

Assume that redundant elements have been incorporated into each of the circuits. If the probe tester indicates that a particular circuit has defective elements (and assuming there are sufficient redundant elements to correct for these defective elements) a laser beam is used to blow the required fuses to couple the redundant elements into the circuit. As presently implemented, the laser moves on a fine grain grid over the size of a circuit, whereas the wafer is moved on a gross grid from circuit to circuit to position the circuit underneath the laser. Thus, the wafer is moved such that the correctable circuit is beneath the laser. The laser is subsequently moved to the fuse positions on the circuit until each fuse required for coupling the redundant elements into the circuit are blown.

The problem is that there is not precise alignment between each of the circuits on the wafer. For example, if the laser beam is directed to a precise point on one circuit when the wafer is stepped to the next circuit, the beam most probably will not strike the same precise point on this circuit. (In contrast, once a precise location is found in a given circuit, such as the pad 12 of FIG. 1, the location of the fuses in that circuit may be precisely determined from that location). In the apparatus used to implement the present invention an error of approximately 12.5 microns can occur from circuit to circuit on a given wafer. Thus, it is necessary to align the laser beam for each circuit on the wafer. (A commercially available laser may be used such as, Electro Scientific Industries, Inc.'s Microlaser, Model 80).

Figure 2:
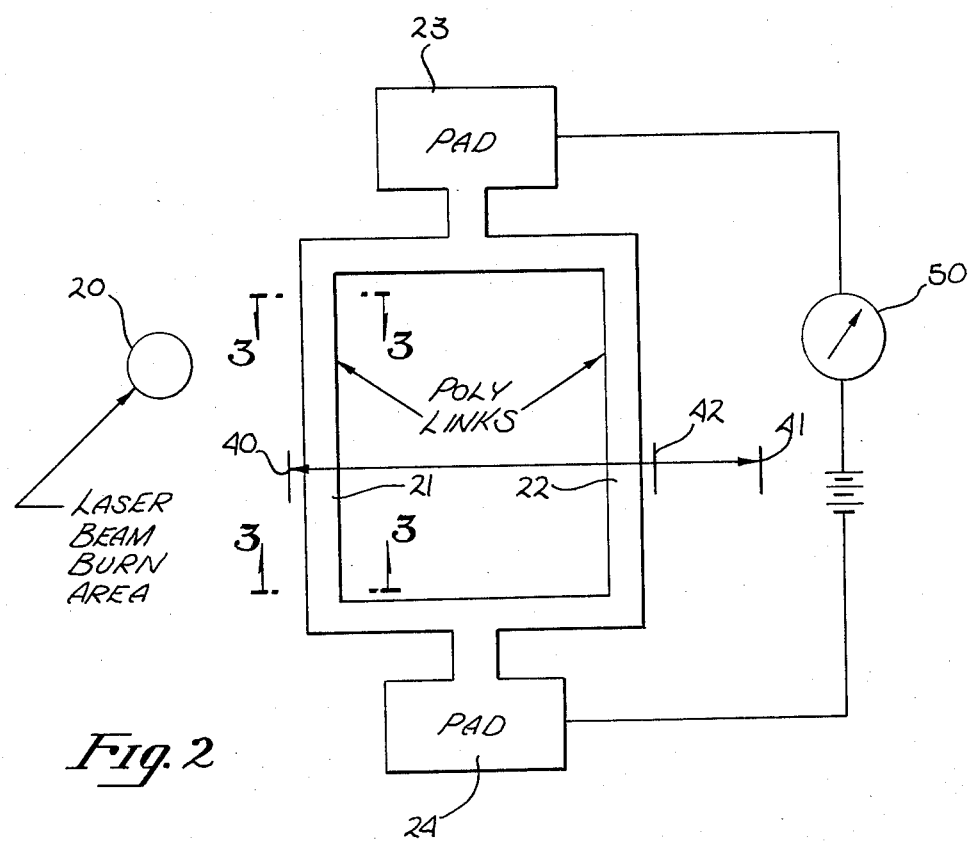
FIG. 2 is a plan view of a pair of links formed in accordance with the present invention. This view also illustrates the positioning of a laser beam during the initial steps of the invention method.

Referring now to FIG. 2, the pair of links 21 and 22 is fabricated on each of the circuits. As shown in FIG. 2, these links are electrically coupled in parallel between pads 23 and 24. In the presently preferred embodiment, the links are fabricated from heavily doped polycrystalline silicon (polysilicon), however, other materials such as aluminum or $TaSi_2$ may be used. The generally parallel, spaced-apart links 21 and 22 are approximately 2 microns wide, 3000A to 6000A thick, and fabricated at a pitch of approximately 20 microns, in the presently preferred embodiment. The length of the links is approximately 25 microns. The pads 23 and 24 are ordinary pads suitable for probe testing, such as aluminum pads. The pads may be located in the "streets" (between the circuits) to conserve substrate area since they need not be used once the wafer is diced. The links 21 and 22 are formed during the formation of other circuit elements such as gates, etc., and may be fabricated from a first level or second level of polysilicon. The resistance of the links 21 and 22 is sensed during the alignment method of the present invention as indicated by the meter 50.

The links are typically covered with a silicon dioxide layer which layer of course is transparent to the laser beam. In the presently preferred embodiment, the outermost protective layer over the integrated circuit (such as a plasma nitride or doped silicon dioxide layer) is thinned above each of the links (and other links or fuses used in the integrated circuit). This reduces the amount of cracking in the glass above and surrounding the link, and the size of the hole that results when the link is blown.

In the invented method, first the laser beam is directed onto the circuit to a site assumed to be the position of link 21. The initial optical alignment of the wafer and the approximate alignment achieved when stepping from circuit to circuit, allows an approximate determination of the location of the link 21. As presently implemented, using this approximate location of the link, the beam is then directed to a position 12.5 microns to the left of link 21. This assures that with a maximum error in this alignment, the beam will be either on the link 21 or to the left of it. Since the links are 25 microns long, the beam will always be along the side of the link after the approximate alignment.

The projection of the laser beam on the circuit is shown as beam 20 in FIG. 2. This beam has a burn diameter of approximately 5 microns for the infrared laser employed (wavelength of 1064 nm). As currently implemented, the laser has an output on the order of megaWatts/cm$^2$ in the five microns burn area.

Once the circuit is positioned as shown, the laser is activated or pulsed (Q-switched). If the link 21 is not substantially destroyed as determined by the current (meter 25) then the laser beam is moved such that the beam is moved towards the link. In the presently preferred embodiment, the laser beam is moved in steps of 1.25 microns and the laser is pulsed after each of these steps as shown in FIG. 3, by the beam 20a, 20b and 20c. (While, as implemented, the beam is moveable and the circuit fixed, it is obvious that the beam can be fixed and the circuit moved towards the link.)

Again, referring to FIG. 3, for beam 20c, there is shown a slight overlap between the beam and the strip 21. In some instances, a portion of the beam will fall on the link, however, sufficient energy will not be imparted to the link to destroy it. The criterion used in the presently preferred embodiment for determining when the beam is coincident with the link, is when the link pair has a 25% increase in resistance.

Referring now to FIG. 4, the beam 20 is stepped until sufficient overlapping of the link 2 occurs to destroy the link in the region 25. This stepping is stopped when the link pairs resistance increases.

The position of the optical system which moves the laser beam is noted when the resistance of the link pairs increases. Then the beam if moved 32.5 microns to the right (the pitch of the links plus 12.5 microns) such that the beam is at the position shown in FIG. 5. That is, the beam is to the right of link 22.

Now the beam 20 is stepped towards the link 22, again in increments of 1.25 microns. This is shown in FIG. 6 with the beam 20a, 20b and 20c. Note that in comparing FIGS. 3 and 6, in one case, the beam is moved to the right (FIG. 3) while in the other case, it is moved in the opposite direction, that is, to the left.

As shown in FIG. 7, eventually sufficient overlapping occurs between the link 22 and the beam such that the link is substantially destroyed. Note as illustrated in FIG. 7, the link may not always be entirely destroyed, thus leaving a portion 29. It is for this reason that a criterion, as discussed above, for determining when a link has been substantially destroyed is necessary.

The beam position at which the link 22 is blown is also noted. A simple computation yields the midpoint between the points, at which the two links were blown. This midpoint, of course, is known to lie on a line centered between the pair of links. The use of this midpoint, rather than of the point at which either link is blown is important as will be described.

The fact that the beam is moved towards the links from opposite directions compensates for errors that might otherwise occur because of the finite beam diameter and finite line width. Viewed another way, if a single link is used, the precise location of the beam relative to the circuit will not necessarily be known, even though the link is destroyed. This is true since the link will not necessarily be destroyed when the beam is precisely centered on the link, that is, the link may be opened after the center of the beam is stepped over the center of the link (FIG. 4) or before the center of the beam passes the center of the link (FIG. 7).

Assume that link 21 is blown when the beam is on line 40 of FIG. 2. The beam is then moved a predetermined distance such that line 41 is beneath the beam. Now the beam is moved towards the link 22 and eventually the link 22 is blown. The beam position when link 22 is blown is determined from the predetermined distance between lines 40 and 41, and the number of steps from line 41 required to blow the link 22. Line 41 is less than 12.5 microns from the center of link 22 since line 40 is to the left of link 21. This causes the apparent location of the beam when link 22 is blown to be to the right of the link as indicated by line 42. The actual location of the beam will be to the left of line 42. Now, when the midpoint between lines 40 and 42 is computed, it will tend to be in the center of the links. Similarly, if link 21A is blown when the center of the beam is beyond the center of link 21, the apparent point at which link 22 is blown will tend to be to the left of the center of link 22. Again, when the midpoint is computed, it will fall midway between the links. Thus by approaching one link from one direction and the other link from the opposite direction, a more precise midpoint between the links can be determined.

Referring now to FIG. 8, in the presently preferred embodiment, two pairs of links 30 and 31 are fabricated on each of the circuits with one set of links being perpendicular to the other. The link pairs 30 and 31 may share a common pad such as pad 33. The center of the link pairs 30 is determined as described above by movement in the directions A and B and by monitoring the current between pads 32 and 33. Similarly, the midpoint between the link pairs 31 is determined by movement in the directions D and C and by monitoring the current between the pads 33 and 34. By knowing a point along a line drawn through the center of the link pairs 30 and 31, precise location of the circuit in both axes relative to the laser beam is readily known.

Figure 9A:
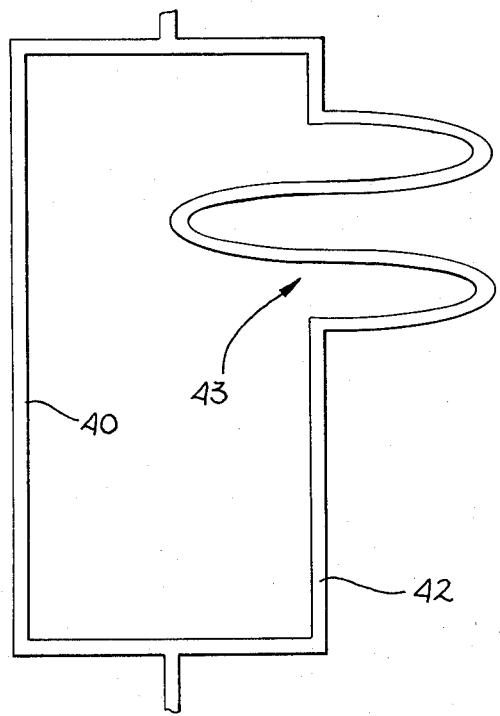
FIG. 9a is a plan view of the presently preferred embodiment of pair of links used in the present invention.

Referring to FIG. 9a, in the presently preferred embodiment, the link pairs are fabricated such that the first link blown has a lower resistance than the second link. For example, in FIG. 9a if link 40 is the first link blown, it has a lower resistance than link 42. In the presently preferred embodiment, the higher resistance in link 42 is obtained by having a serpentine section 43 thus providing link 42 with a longer path. (This serpentine section is not in a region that is involved in the irradiation, thus the overall length of the fuse pairs of FIG. 9a is longer.) Other means may be used to obtain a higher resistance in one link than another, for example, different thicknesses or widths of the polysilicon can be used.

Figure 9B:
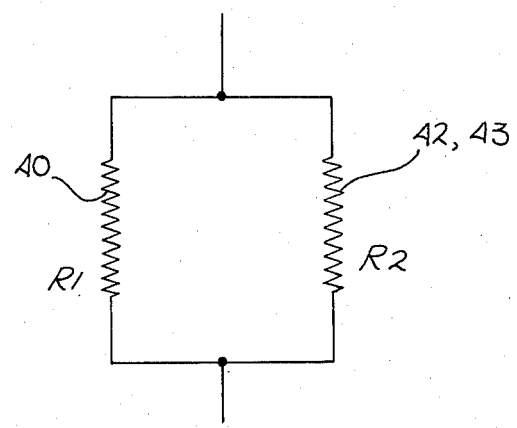

Referring to FIG. 9b, assume that $R_1$ has a lower resistance than $R_2$. The combined resistance for this parallel connection is substantially determined by resistance $R_1$. Thus, when the resistance $R_1$ is altered by the laser beam, there is a larger percentage change in resistance of the pair than, for example, if $R_2$ is first blown or if $R_1$ and $R_2$ have the same resistance. This makes the detection of a change in resistance easier. Once $R_1$ has been blown then the fact that $R_2$ has a higher resistance is insignificant since it is substantially the only resistance in the circuit.

Thus, a method has been described for aligning a wafer relative to a laser beam by a "trail and error" technique. By employing link pairs and by approaching them from opposite sides, compensation is provided for error which would be associated with a finite burn area and a finite link width.

We claim:

1. A method for determining the position of a laser beam on an integrated circuit comprising the steps of:
   forming a first and second spaced-apart, generally parallel links in said circuit;
   positioning said laser beam on said circuit to a position known to be spaced-apart from said first link;
   changing the relative position of said laser beam and said first link by movement in a first direction such that the distance between said first link and laser beam is decreased;
   monitoring the electrical characteristics of said first link to determine when said electrical characteristics of said first link are substantially altered by said laser beam;
   positioning said laser beam on said circuit to a position known to be spaced-apart from said second link;
   changing the relative position of said laser beam and said second link by movement in a second direction opposite to said first direction such that the distance between said second link and said laser beam is decreased;

monitoring the electrical characteristics of said second link so as to determine when said electrical characteristics of said second link are substantially altered by said laser beam;

whereby by knowing the position of said laser beam on said circuit when the electrical characteristics of said first and second links are altered by said laser beam, the precise position of said laser beam on said circuit is determined.

2. The method defined by claim 1 wherein said forming steps comprises forming first and second polysilicon links.

3. The method defined by claim 2 wherein said changing of said relative position of said laser beam and said first and second links comprises moving said laser beam relative to a stationary circuit.

4. The method defined by claim 2 wherein said first and second links are electrically coupled in parallel.

5. The method defined by claim 4 wherein said monitoring comprises monitoring of the resistance of said links.

6. The method defined by claim 5 wherein said first link has less resistance than said second link.

7. The method defined by claim 1 wherein said circuit includes an additional pair of links which are perpendicular to said first and second links, and wherein said positioning, changing and monitoring steps are repeated for said additional pair of links so that the position of said laser beam is determined in orthogonal directions.

8. A method for determining the position of a moveable laser beam on an integrated circuit which circuit is mounted on a stationary surface, comprising the steps of:

forming a first and second spaced-apart, generally parallel, links in said circuit which links are electrically coupled in parallel;

moving said beam to a first position where it is known that said beam will be spaced-apart from said first link;

monitoring the resistance of said links while moving said laser beam in a first direction towards said first link so as to determine a first position at which said resistance of said links changes because of at least partial destruction of said first link by said beam;

moving said beam to a position where it is known that said beam will be spaced-apart from said second link;

monitoring the resistance of said links while moving said beam towards said second link so as to determine a second position at which said resistance of said links changes because of at least partial destruction of said second link by said beam, said movement of said beam being made in a second direction opposite said first direction;

whereby the precise location of said laser beam in said first and second direction is readily determined from said first and second positions.

9. The method defined by claim 8 wherein said moving of said beam towards said links is done in discrete steps and wherein after each step the laser is activated to produce a beam.

10. The method defined by claim 8 wherein said first link has less resistance than said second link.

11. The method defined by claim 8 wherein said position to which said beam is moved spaced-apart from said second link, is a predetermined distance from said first position.

12. The method defined by claim 8 including the formation of an additional pair of spaced-apart, parallel, links which are perpendicular to said first and second links, and performing said moving and monitoring steps for these additional links such that the position of said beam on said circuit in the direction perpendicular to said first and second directions is determined.

13. The method defined by claim 8 wherein said forming of links comprises forming heavily doped polysilicon links.

* * * * *